United States Patent
Arnold et al.

(10) Patent No.: US 8,119,531 B1
(45) Date of Patent: Feb. 21, 2012

(54) MASK AND ETCH PROCESS FOR PATTERN ASSEMBLY

(75) Inventors: John C. Arnold, North Chatham, NY (US); Sean D. Burns, Hopewell Junction, NY (US); Matthew E. Colburn, Schenectady, NY (US); Yunpeng Yin, Guilderland, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/013,935

(22) Filed: Jan. 26, 2011

(51) Int. Cl.
*H01L 21/311* (2006.01)
(52) U.S. Cl. .. 438/702; 438/694; 438/700; 257/E21.258
(58) Field of Classification Search .................. 438/694, 438/700, 702
See application file for complete search history.

(56) References Cited

U.S. PATENT DOCUMENTS

| | | | | |
|---|---|---|---|---|
| 6,498,399 | B2* | 12/2002 | Chung et al. | 257/774 |
| 7,892,974 | B2* | 2/2011 | Ring et al. | 438/675 |
| 2003/0151020 | A1* | 8/2003 | Lee et al. | 252/2 |
| 2004/0207091 | A1* | 10/2004 | Wang et al. | 257/758 |
| 2005/0054194 | A1* | 3/2005 | Tsai et al. | 438/638 |
| 2007/0212872 | A1* | 9/2007 | Daubenspeck et al. | 438/620 |
| 2009/0142931 | A1* | 6/2009 | Wang et al. | 438/734 |
| 2010/0130019 | A1* | 5/2010 | Ohuchi | 438/717 |
| 2011/0027996 | A1* | 2/2011 | Kim et al. | 438/693 |
| 2011/0032763 | A1* | 2/2011 | Kwak et al. | 365/185.05 |
| 2011/0130007 | A1* | 6/2011 | Ching et al. | 438/710 |

* cited by examiner

*Primary Examiner* — Alexander Ghyka
(74) *Attorney, Agent, or Firm* — Scully, Scott, Murphy & Presser, P.C.; Wenjie Li, Esq.

(57) ABSTRACT

A method of forming a trench is provided that includes providing a stack having a semiconductor layer or dielectric layer, a metal nitride layer, a leveling layer, and a first mask layer. First trenches are etched through the first mask layer and the leveling layer. The first mask layer is removed. A second mask layer is formed on the leveling layer. Second trenches are formed through the second mask layer, wherein the base of the second trenches do not extend through the metal nitride layer. The second mask layer is removed. Exposed portions of the metal nitride layer are etched selectively to the semiconductor layer and remaining portions of the leveling layer to extend the first trenches and the second trenches into contact with an upper surface of the semiconductor layer.

20 Claims, 6 Drawing Sheets

MASK AND ETCH PROCESS FOR PATTERN ASSEMBLY

BACKGROUND

The present disclosure relates to semiconductor devices. More particularly, the present disclosure relates to forming trenches in semiconductor substrates.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties.

SUMMARY

In one embodiment, a method of forming trenches is provided, in which inconsistencies in the trench depth are minimized using a leveling layer. In one embodiment, the method of forming trenches includes providing a material stack including a semiconductor layer or dielectric layer, a metal nitride layer present on the semiconductor layer or the dielectric layer, a leveling layer that is present on the metal nitride layer, and at least one first mask layer on the leveling layer. A first plurality of trenches having a first pitch is etched through the at least one mask layer and the leveling layer, wherein the base of the first plurality of trenches stops on the metal nitride layer. By "stops on" it is meant that the first plurality of trenches either stops on the upper surface of the metal nitride layer or does not extend through the entirety of the metal nitride layer. After forming the first plurality of trenches, the at least one first mask layer may be removed.

At least one second mask layer is formed on the leveling layer and on an exposed portion of the metal nitride layer. A second plurality of trenches having a second pitch is etched through at least the at least one second mask layer, wherein the base of the second plurality of trenches does not extend through the metal nitride layer. The at least one second mask layer is removed. The exposed portion of the metal nitride layer is etched selectively to the semiconductor layer or the dielectric layer and the remaining portions of the leveling layer to extend the first plurality of trenches and the second plurality of trenches into contact with an upper surface of the semiconductor layer or the dielectric layer.

In another embodiment, a method of forming a trench is provided that may include providing a material stack comprising a silicon layer or dielectric layer, a titanium nitride layer present on the silicon layer or a dielectric layer, and a silicon dioxide ($SiO_2$) layer present on the titanium nitride layer. A first masking stack is formed on the material stack that includes a first carbon-containing planarization layer that is present on the silicon oxide ($SiO_2$) layer. A first plurality of trenches having a first pitch is etched through the at least one mask layer and the silicon oxide ($SiO_2$) layer, wherein the base of the first plurality of trenches stops on the titanium nitride layer. The first masking stack is removed. A second masking stack including a second carbon-containing planarization layer is formed on the silicon oxide ($SiO_2$) layer and an exposed portion of the titanium nitride layer. A second plurality of trenches having a second pitch is etched through at least the second masking stack and the silicon dioxide ($SiO_2$), wherein the base of the second plurality of trenches does not extend through the titanium nitride layer in an overlapping trench portion between the first plurality of trenches and the second plurality of trenches. The exposed portions of the titanium nitride layer are etched selectively to the silicon layer or the dielectric layer and remaining portions of the silicon oxide ($SiO_2$) layer to extend the first plurality of trenches and the second plurality of trenches into contact with an upper surface of the silicon layer or the dielectric layer.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
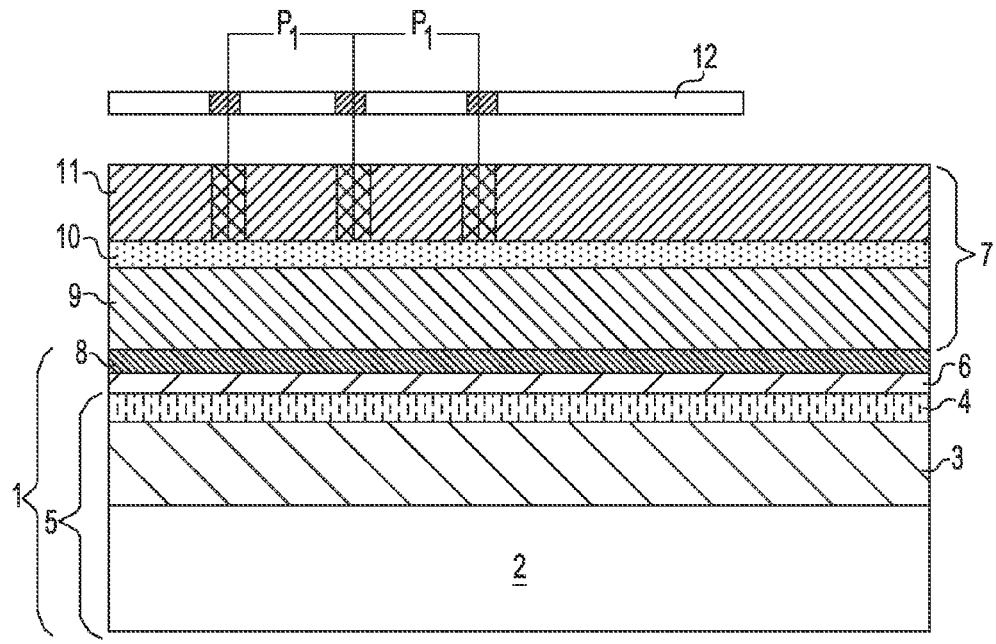
FIG. 1 is a side cross-sectional view of patterning a portion of at least one first mask layer that is present over a material stack that includes a leveling layer, wherein the pattern corresponds to a first plurality of trenches having a first pitch, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Pitch splitting is a multiple lithographic patterning and multiple etch approach for forming trench structures that includes at least two photoresist exposures (to double the pitch) and at least two etch processes. Each lithographic pattern may have a separate pitch. In some instances, an overlap region exists between two lithographic patterns. The overlap region may be referred to as a stitch region. For example, the first lithographic pattern than provides a first pitch may overlap with the second lithographic pattern that provides a second pitch. The portion of the etched surface within the overlap region is subjected to each of etch process for each of the first and second lithographic patterns, wherein the remaining portion of the etch surface that is outside the overlap region is only subjected to the etch for only one of the first and second lithographic patterns. Because the overlap region is subjected to multiple etches, a stitch recess region is formed in the overlap region that is not present in the remainder of the etched structure. The stitch recess region can cause non-uniformity in the etched features, i.e., differences in etch depth for the features being etched.

In one example, in which a metal nitride layer, e.g., a titanium nitride layer, is present over a semiconductor layer, or a dielectric layer, such as a low-k dielectric layer, the etch processes to form the second plurality of trenches includes a step to remove the photolithography layer, e.g., antireflective coatings, and this will result in recess into the semiconductor layer in the stitched region, i.e., stitch recess region, between the two exposures as the titanium nitride layer in the stitched region has already been etched through when forming the first plurality of trenches. The recess in stitching regions, i.e., stitch recess region, can eventually be transferred to an underlying dielectric layer, and form uneven trench depths. To reduce stitch recess region formation, the method disclosed herein may utilize a leveling layer that is present over the metal nitride layer. In some embodiments, the lithographic exposure for each pitch is memorized into the leveling layer, wherein the leveling layer functions as a mask during etching of the metal nitride layer.

FIG. 1 depicts patterning a portion of at least one first mask layer (hereafter referred to as first mask stack 7) that is present over a material stack 1 that includes a leveling layer 8, wherein the pattern corresponds to a first plurality of trenches having a first pitch P1. In one embodiment, the material stack 1 includes a metal nitride layer 6 that is formed on the upper surface of a substrate 5 having a semiconductor on insulator (SOI) arrangement. In one embodiment, the substrate 5 includes an upper semiconductor layer 4 that is present over a buried dielectric layer 3. The buried dielectric layer 3 is present over a base semiconductor layer 2.

The upper semiconductor layer 4 may include any semiconducting material including, but not limited to, Si, strained Si, SiC, SiGe, SiGeC, Si alloys, Ge, Ge alloys, GaAs, InAs, and InP, or any combination thereof. In one embodiment, the upper semiconductor layer 4 has a thickness ranging from 1.0 nm to 10.0 nm. In another embodiment, the upper semiconductor layer 4 has a thickness ranging from 1.0 nm to 5.0 nm. In a further embodiment, the upper semiconductor layer 4 has a thickness ranging from 3.0 nm to 8.0 nm.

The buried dielectric layer 3 may be composed of any dielectric material including, but not limited to, an oxide, a nitride, an oxynitride or any combination thereof. In one embodiment, the buried dielectric layer 3 has a thickness ranging from 1.0 nm to 10.0 nm. In another embodiment, the buried dielectric layer 3 has a thickness ranging from 1.0 nm to 5.0 nm. In a further embodiment, the buried dielectric layer 3 has a thickness ranging from 3.0 nm to 8.0 nm. In one example, the buried dielectric layer 3 is composed of silicon oxide ($SiO_2$). The base semiconductor layer 2 may be a semiconducting material including, but not limited to, Si, strained Si, SiC, SiGe, SiGeC, Si alloys, Ge, Ge alloys, GaAs, InAs, InP as well as other III/V and II/VI compound semiconductors.

The buried dielectric layer 3 that is present underlying the upper semiconductor layer 4 and atop the base semiconductor layer 2 may be formed by implanting a high-energy dopant into the semiconductor substrate 5 and then annealing the structure to form a buried oxide layer, i.e., buried dielectric layer 3. In another embodiment, the buried dielectric layer 3 may be deposited or grown prior to the formation of the upper semiconductor layer 4. In yet another embodiment, the semiconductor substrate 5 may be formed using wafer-bonding techniques, where a bonded wafer pair is formed utilizing glue, adhesive polymer, or direct bonding. Although, the upper semiconductor layer 4, the buried dielectric layer 3 and the base semiconductor layer 2 have been described as a semiconductor on insulator (SOI) substrate arrangement, the base semiconductor layer 2 may be provided by a bulk semiconductor substrate and the buried dielectric layer 3 and the upper semiconductor layer 4 may be deposited layers that are formed on the bulk semiconductor substrate. The upper semiconductor layer 4 is hereafter referred to as a semiconductor layer 4, and the buried dielectric layer 3 is hereafter referred to as a dielectric layer 3.

Although one application of the disclosure is for front end of the line (FEOL) SOI integration and etches, as described above with respect to the base semiconductor layer 2 and the buried dielectric layer 3, the present disclosure is equally applicable to back end of the line (BEOL) interconnect applications, in which the substrate may contain (top to bottom), a first dielectric layer, a second dielectric layer, and a capping layer. In the embodiments, in which a back end of the line (BEOL) process is being employed, the first dielectric layer may be provided by the metal nitride layer 6, and the second dielectric layer replaces the upper semiconductor layer 4 that is depicted in FIG. 1, and the capping layer is equivalent to the buried dielectric layer identified by reference number 3 in FIG. 1. In one embodiment, the second dielectric layer is a low-k dielectric layer. The term "low-k" refers to a dielectric material having a dielectric constant that is less than 4.0 at room temperature, i.e., 20° C. to 25° C. In one embodiment, the low-k dielectric layer has a dielectric constant ranging from 1.75 to 3.5. In another embodiment, the low-k dielectric layer has a dielectric constant ranging from 2.0 to 3.2. In yet an even further embodiment, the low-k dielectric layer has a dielectric constant ranging from 2.25 to 3.0. Examples of materials suitable for the low-k dielectric layer include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. In one example, the low-k dielectric layer may be composed of silicon oxide ($SiO_2$). In one example, the low-k dielectric layer is formed from tetraethyl orthosilicate ($Si(OC_2H_5)_4$). The second dielectric layer, preferably being a low-k dielectric layer, is hereafter referred to as a "dielectric layer".

The metal nitride layer 6 is formed on an upper surface of the semiconductor layer 4 or the dielectric layer. In one embodiment, the metal nitride layer 6 is composed of WN, WSiN, TiN, TiSiN, TaN, TaSiN, TiTaN, TaRuN or combinations thereof. In one embodiment, the metal nitride layer 6 has a thickness ranging from 10 nm to 100 nm. In another embodiment, the metal nitride layer 6 has a thickness ranging from 20 nm to 50 nm. In one embodiment, the metal nitride layer 6 is deposited using chemical vapor deposition (CVD), sputtering or plating. In one embodiment, the metal nitride layer 6 is composed of TiN and is deposited using sputtering. As used herein, "sputtering" means a method for depositing a film of metallic material, in which a target of the desired material, i.e., source, is bombarded with particles, e.g., ions, which knock atoms from the target, where the dislodged target material deposits on a deposition surface. Examples of sputtering apparatus that may be suitable for depositing the metal nitride layer 6 include DC diode type systems, radio frequency (RF) sputtering, magnetron sputtering, and ionized metal plasma (IMP) sputtering. In one example, the metal nitride layer 6 is composed of TiN.

The leveling layer 8 is formed on an upper surface of the metal nitride layer 6. The leveling layer 8 may be composed of a dielectric material, such as an oxide, nitride or oxynitride material. In one embodiment and when the leveling layer 8 is composed of an oxide-containing material, the leveling layer 8 is silicon oxide ($SiO_2$). In another example, when the leveling layer 8 is composed of a nitride, the leveling layer 8 is composed of silicon nitride ($Si_3N_4$). The leveling layer 8 may be deposited using chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include but are not limited to, Atmospheric Pressure CVD (APCVD), Low Pressure CVD (LPCVD) and Plasma Enhanced CVD (EPCVD), Metal-Organic CVD (MOCVD) and others. In addition to chemical vapor deposition (CVD), the leveling layer 8 may also be formed using spinning from solution, spraying from solution, and evaporation. In one embodiment, the leveling layer 8 has a thickness ranging from 10 nm to 100 nm. In another embodiment, the leveling layer 8 has a thickness ranging from 30 nm to 50 nm.

Still referring to FIG. 1, the first mask stack 7 that is present on the upper surface of the leveling layer 8 may include a first organic planarization layer (OPL) 9, an first anti-reflective coating (ARC) 10, and a first photoresist layer 11. The first organic planarization layer (OPL) 9 is formed on the upper surface of the leveling layer 8. The first organic planarization layer (OPL) 9 may be composed of any carbon-containing material that can be selectively etched to the leveling layer 8. In some instances, the first organic planarization layer (OPL) 9 may be referred to as a carbon-containing planarizing layer. In one embodiment, the first organic planarization layer (OPL) 9 can be composed of polyacrylate resin, epoxy resin, phenol resin, polyamide resin, polyimide resin, unsaturated polyester resin, polyphenylenether resin, polyphenylenesulfide resin, benzocyclobutene (BCB) or a combination thereof. The first organic planarization layer (OPL) 9 may be formed using chemical vapor deposition (CVD), spinning from solution, spraying from solution, and evaporation. In one embodiment, the first organic planarization layer (OPL) 9 has a thickness ranging from 100 nm to 300 nm. In another embodiment, the organic planarization layer (OPL) 9 has a thickness ranging from 100 nm to 200 nm.

The first anti-reflective coating (ARC) 10 is formed on the upper surface of the first organic planarization layer (OPL) 9. The first anti-reflective coating (ARC) 10 may be designed to control reflection of light that is transmitted through the first photoresist layer 11 (to be subsequently formed), reflected off the underlying material layers and back into the first photoresist layer 11, where it can interfere with incoming light and cause the first photoresist layer 11 to be unevenly exposed. The thickness of the first anti-reflective coating (ARC) 10 may vary depending on the technique used to form the same as well as the material make-up of the layer. Typically, the first anti-reflective coating (ARC) 10 has a thickness ranging from 10 nm to 100 nm. In another embodiment, the first anti-reflective coating (ARC) 10 has a thickness ranging from 35 nm to 80 nm. The first anti-reflective coating (ARC) 10 may be either organic or inorganic.

In one embodiment, the first anti-reflective coating (ARC) 10 may include homopolymers or copolymers of polyesters, polyimides, polyacrylates, polymethacrylates, polysulfones, amorphous carbon, and the like and may be applied by spin-on techniques, spray on techniques, dipping, etc. Inorganic antireflective coatings, such as silicon oxide ($SiO_2$), silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may also be employed and may be deposited, for example, by plasma-enhanced chemical vapor deposition, spin-on techniques, dipping, etc. After applying the first anti-reflective coating (ARC) 10, particularly those from a liquid phase, a post deposition baking step is usually employed to remove unwanted components, such as solvent, and to effect crosslinking. In one embodiment, the post deposition baking step for the first anti-reflective coating (ARC) 10 is at a temperature that ranges from 80° C. to 300° C. In another embodiment, the baking temperature ranges from 120° C. to 200° C.

A first photoresist layer 11 is formed on the upper surface of the first anti-reflective coating (ARC) 10. Photoresists are classified into two groups: positive resists and negative resists. A positive resist is a type of photoresist in which the portion of the photoresist that is exposed to light becomes soluble to the photoresist developer. The portion of the photoresist that is unexposed remains insoluble to the photoresist developer. A negative resist is a type of photoresist in which the portion of the photoresist that is exposed to light becomes insoluble to the photoresist developer. The unexposed portion of the photoresist is dissolved by the photoresist developer. In some embodiments, the first photoresist layer 11 may be composed of the Poly(vinyl cinnamate), Poly(methyl methacrylate) (PMMA), Poly(methyl glutarimide) (PMGI), Phenol formaldehyde resin (DNQ/Novolac) or multi-layers and combinations thereof.

The first photoresist layer 11 may be deposited on the upper surface of the first anti-reflective coating (ARC) 10 using spin on deposition, spray coating or chemical solution deposition. The first photoresist layer 11 may have a thickness ranging from 50 nm to 150 nm. In another embodiment, the first photoresist layer 11 may have a thickness ranging from 50 nm to 100 nm.

Figure 2:
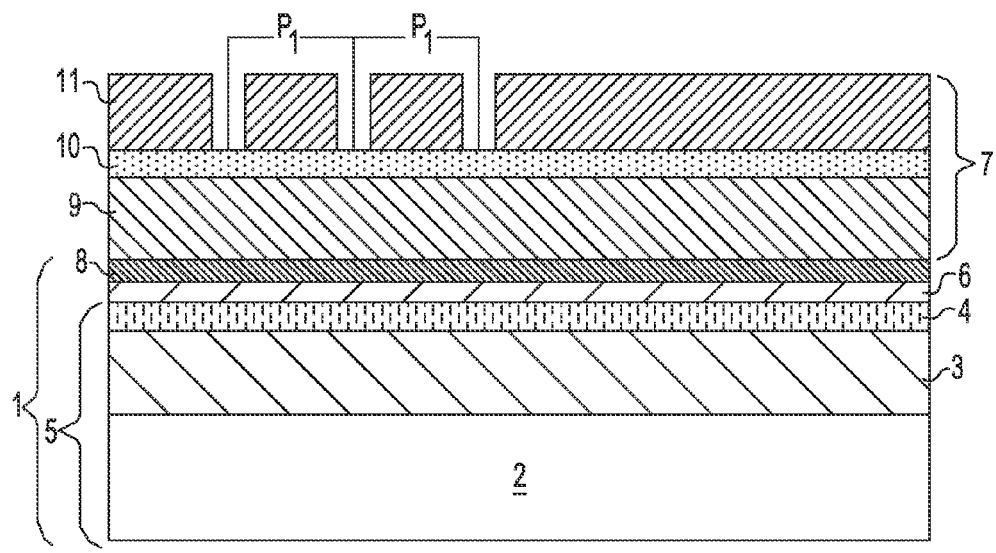
FIG. 2 is a side cross-sectional view of developing the pattern of the first plurality of trenches into the photoresist layer of the at least one first mask layer, in accordance with one embodiment of the present disclosure.

Referring to FIGS. 1 and 2, the first photoresist layer 11 may be patterned and developed to form an etch mask corresponding to a first plurality of trenches having a first pitch P1. By "patterned" it is meant that the first photoresist layer 11 is selectively irradiated to light through a stencil, e.g., reticle, that is designed to allow light to fall only on preselected areas of the first photoresist layer 11, e.g., areas that define a first plurality of trenches having a first pitch. The light causes a chemical change, e.g., cross-linking, in the first photoresist layer 11. The stencil (hereafter referred to as a first reticle 12) comprises a transparent substrate and a pattern layer. The radiant energy blocking portion may be comprised of chrome, chrome oxide, chromium nitride, iron oxide, silicon or a number of other opaque materials. The pattern layer corresponds to the first pitch P1 that provides the first plurality of trenches. The term "pitch" means the center-to-center distance between two repeating elements of a semiconductor device. In one embodiment, the pitch may be measured from the center of a first trench to the center of an adjacent trench. The actual dimensions for the first pitch P1 may depend upon the technology node. In one example, the first pitch P1 is less than 500 nm. In another example, the first pitch P1 ranges from 20 nm to 450 nm. In yet another example, the first pitch P1 ranges from 40 nm to 300 nm. In yet an even further example, the first pitch P1 ranges from 80 nm to 150 nm.

The radiation, i.e., light, that may be used to expose the first photoresist layer 11 through the first reticle 12 may include UV, DUV, and the H and I lines of a mercury-vapor lamp. In another embodiment, first photoresist layer 11 may be exposed with an ion beam. Depending upon whether the photoresist is a positive resist or a negative resist, either the exposed portion or the unexposed portion of the first photoresist layer 11 may be washed away, i.e., removed, using a developer. Examples of developers for use with positive resists include sodium hydroxide (NaOH) and tetramethyl ammonium hydroxide (TMAH) to be used in combination with a water rinse ($H_2O$). Examples of developers for use with negative resists include xylene with a rinse composed of n-Butylacetate. The remaining portion of the first photoresist layer 11 provides an etch mask for the underlying first anti-reflective coating (ARC) 10, as depicted in FIG. 2.

Figure 3:
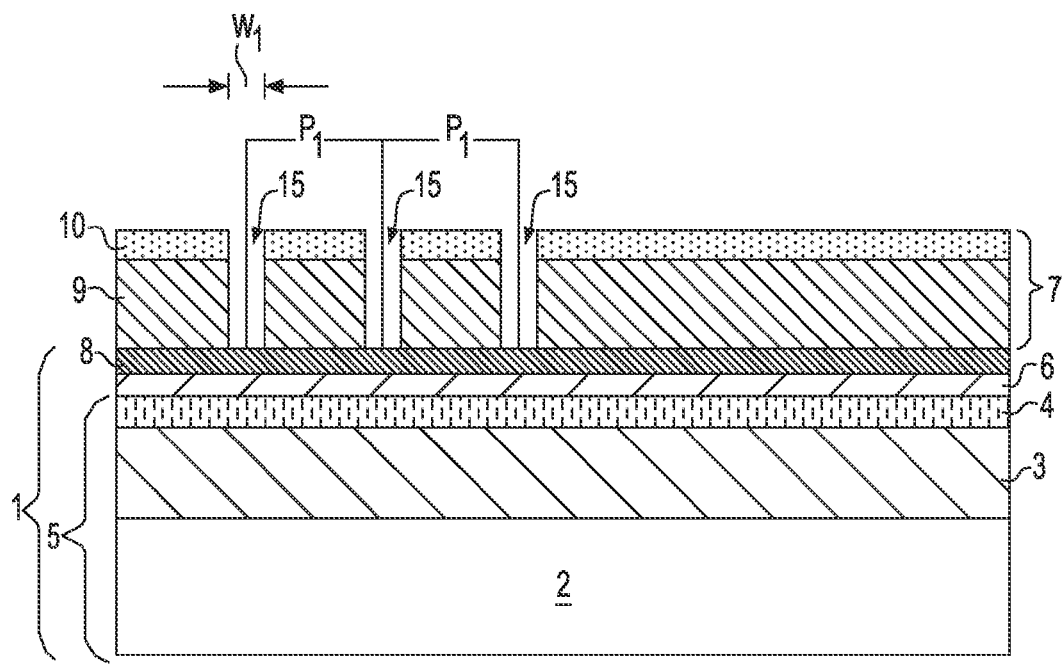
FIG. 3 is a side cross-sectional view of etching the pattern for the first plurality of trenches having a first pitch into a first organic planarization layer (OPL) of the at least one first mask layer with an etch process that is selective to the leveling layer, in accordance with one embodiment of the present disclosure.

FIG. 3 depicts etching the pattern for the first plurality of trenches 15 having a first pitch P1 into a first organic planarization layer (OPL) 9 of the first masking layer 7 with an etch that is selective to the leveling layer 8. In one embodiment, the pattern for the first plurality of trenches 15 having the first pitch P1 is etched through the first anti-reflective coating (ARC) 10 and the first organic planarization layer (OPL) 9 with an etch process that is selective to the leveling layer 8. The patterned first photoresist layer 11 provides the mask for etching the first plurality of trenches 15 having a first pitch P1 into a first organic planarization layer (OPL) 9. Following etching of the first organic planarization layer (OPL) 9, the first photoresist layer 11 may be removed using oxygen ashing or a chemical strip. In one embodiment, the first photoresist layer 11 may be removed naturally by the etch process that forms the first plurality of trenches 15.

As used herein, the term "selective" in reference to a material removal process denotes that the rate of material removal for a first material is greater than the rate of removal for at least another material of the structure to which the material removal process is being applied. In one example, the etch that removes the exposed portions of the first anti-reflective coating (ARC) 10 and the first organic planarization (OPL) 9 has a selectivity ranging from 1:1 to 100:1 relative to the leveling layer 8. In another embodiment, the etch that removes the exposed portions of the first anti-reflective coating (ARC) 10 and the first organic planarization (OPL) 9 has a selectivity ranging from 1:1 to 5:1 relative to the leveling layer 8.

The etch process for forming the first plurality of trenches 15 having a first pitch P1 into a first organic planarization layer (OPL) 9 may be an anisotropic etch process. An anisotropic etch process is a material removal process in which the etch rate in the direction normal to the surface to be etched is greater than in the direction parallel to the surface to be etched. The anisotropic etch may include reactive-ion etching (RIE). Reactive ion etching (RIE) is a form of plasma etching in which during etching the surface to be etched is exposed to reactive gases in the presence of an RF field. During reactive ion etching (RIE) the surface to be etched takes on a potential that accelerates the reactive species extracted from a plasma toward the surface, in which the chemical etching reaction is taking place in the direction normal to the surface. The anisotropic etch may also be provided by ion-beam etching, plasma etching or laser ablation. The width W1 of each trench in the first plurality of trenches 15 may range from 20 nm to 250 nm. In another embodiment, the width of each trench in the first plurality of trenches 15 may range from 20 nm to 250 nm.

In one embodiment, in which the first photoresist layer 11 is composed of photosensitive carbon containing polymers, the first anti-reflective coating (ARC) 10 is composed of silicon containing organic material, the first organic planarization (OPL) layer 9 is composed of carbon-hydrogen containing polymers, and the leveling layer 8 is composed of silicon oxide ($SiO_2$), the etch process for etching the first plurality of trenches 15 having a first pitch P1 into a first organic planarization layer (OPL) 9 may include a first etch of the first anti-reflective coating (ARC) 10 with fluorocarbon plasmas using the first photoresist layer 11 as a mask. In one embodiment, the first etch of the first anti-reflective coating (ARC) includes 5 sccm to 15 sccm $C_4F_8$, 60 sccm to 100 sccm $CF_4$, and 40 sccm to 60 sccm $CHF_3$, a pressure level ranging from 10 mTorr to 20 mTorr, a top RF power level ranging from 400 W to 600 W, and a bottom RF power level ranging from 80 W to 120 W. In one example, the first etch of the first anti-reflective coating (ARC) 10 with fluorocarbon plasma includes 10 sccm $C_4F_8$, 80 sccm $CF_4$ and 50 sccm $CHF_3$, with a pressure level at 15 mTorr, and with top and bottom RF power levels of 500 W and 100 w respectively. In a following etch step, the first organic planarization (OPL) layer 9 is etched using the remaining portion of the first anti-reflective coating (ARC) 10 as a mask. In one embodiment, the first planarization (OPL) layer 9 is etched by a plasma that contains 50 sccm to 70 sccm hydrogen bromide (HBr), 60 sccm to 100 sccm $CO_2$, 30 sccm $O_2$ to 50 sccm $O_2$, 160 sccm to 240 sccm He, a pressure ranging from 15 mTorr to 20 mTorr, a top RF power that ranges from 400 W to 600 W, and a low RF power that ranges from 100 W to 200 W. In one example, the first organic planarization (OPL) layer 9 is etched by a plasma that contains 60 sccm hydrogen bromide (HBr), 80 sccm $CO_2$, 40 sccm $O_2$ and 200 sccm He, with a pressure of 20 mTorr, and top and bottom RF power levels of 500/150 W respectively.

Figure 4:
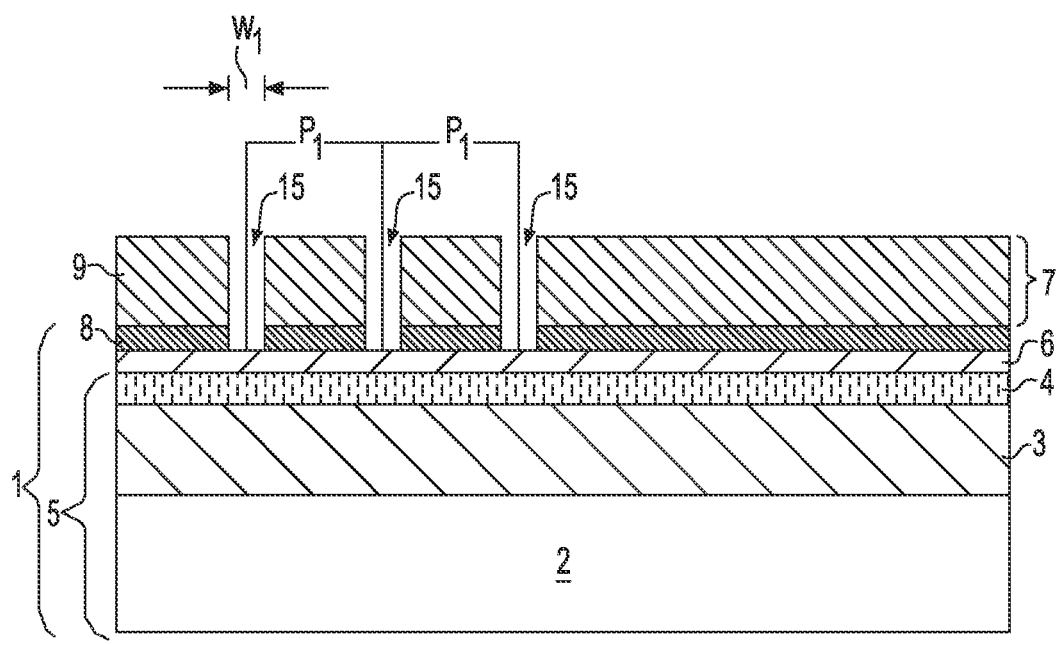
FIG. 4 is a side cross-sectional view of etching the pattern for the first plurality of the trenches into the leveling layer with an etch process that is selective to a metal nitride layer of the material stack, in accordance with one embodiment of the present disclosure.

FIG. 4 depicts one embodiment of etching the pattern for the first plurality of the trenches 15 into the leveling layer 8 with an etch that is selective to the metal nitride layer 6 of the material stack 1. The first anti-reflective coating (ARC) 10 may be removed prior to etching of the pattern for the first plurality of the trenches 15 into the leveling layer 8, or may be removed during the etching of the pattern for the first plurality of the trenches 15 into the leveling layer 8. In the embodiment, in which the first anti-reflective coating (ARC) 10 is removed prior to etching of the pattern for the first plurality of the trenches 15 into the leveling layer 8, the first anti-reflective coating (ARC) 10 may be removed using fluorocarbon containing plasma etch chemistry. In the embodiment, in which the first anti-reflective coating (ARC) 10 is removed during the etching of the pattern for the first plurality of the trenches 15 into the leveling layer 8, the first anti-reflective coating (ARC) 10 may be removed using selective etching. In one example, the first anti-reflective coating (ARC) 10 is removed by an etch that is selective to the underlying first organic planarization layer (OPL) 9. In another example, the first anti-reflective coating (ARC) 10 is removed by the etch that removes the exposed portion of the leveling layer 8 selective to the metal nitride layer 6.

In one example, the etch that removes the exposed portions of the leveling layer 8 has a selectivity ranging from 5:1 to 100:1 relative to the metal nitride layer 6. In another embodiment, the etch that removes the exposed portions of the leveling layer 8 has a selectivity ranging from 10:1 to 100:1 relative to the metal nitride layer 6.

The etch process for removing the exposed portions of the leveling layer 8 may be an anisotropic etch process. The anisotropic etch may include reactive-ion etching (RIE), ion-beam etching, plasma etching or laser ablation. By removing the exposed portions of the leveling layer 8, the first plurality of trenches 15 is extended into the leveling layer 8, wherein the base of the first plurality of trenches 15 is in direct contact with the metal nitride layer 6. The width of each extended trench portion of the first plurality of trenches 15 can be equal, smaller or bigger than the width of the first plurality of trenches prior to etching into the leveling layer 8, depending on the amount of etch shrink during leveling layer 8 etch.

In one embodiment, in which the first organic planarization (OPL) layer 9 is composed of carbon-hydrogen containing polymers, the leveling layer 8 is composed of silicon oxide ($SiO_2$), and the metal nitride layer 6 is comprised of titanium nitride, the etch process for etching the exposed portions of the leveling layer 8, and extending the base of the first plurality of trenches 15 into direct contact with the metal nitride layer 6 includes etching into the leveling layer 8 in fluorocarbon plasmas using the first anti-reflective coating (ARC) layer 10 and the first organic planarization layer (OPL) 9 as the masking layers. In one example, the etch chemistry contains 50 sccm $CHF_3$, 5 sccm $O_2$ and 50 sccm $CF_4$, with the pressure of 40 mTorr, and the top and bottom RF powers of 600 W and 100 W, respectively.

Figure 5:
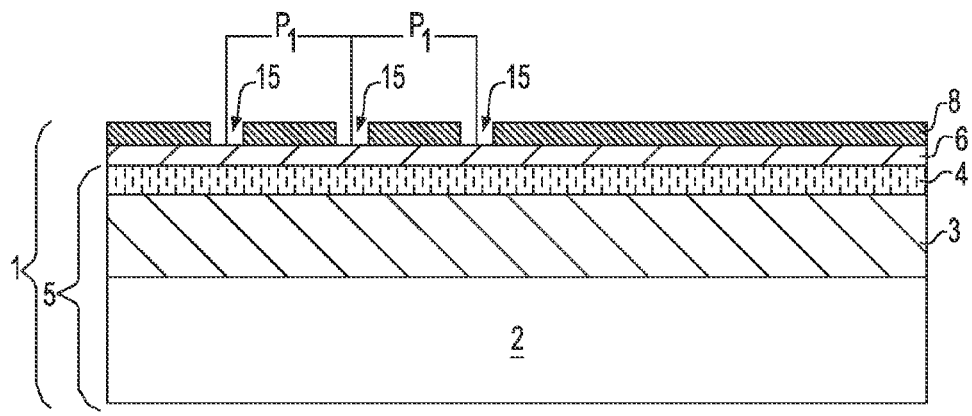
FIG. 5 is a side cross-sectional view depicting removing the at least one first mask layer, in accordance with one embodiment of the present disclosure.

FIG. 5 depicts one embodiment of removing the at least one first mask layer 7 to expose an upper surface of the remaining portion of the leveling layer 8 and the exposed portions of the metal nitride layer 6. In one embodiment, removing the at least one first mask layer 7 includes removing the first organic polymerization layer (OPL) 9. The first organic polymerization layer (OPL) 9 may be removed using a selective etch or a chemical strip.

In one example, in which the organic polymerization layer (OPL) 9 is composed of carbon-hydrogen containing polymers, the leveling layer 8 is composed of silicon oxide ($SiO_2$), and the metal nitride layer 6 is composed of titanium nitride (TiN), the organic polymerization layer (OPL) 9 is removed by oxygen containing etch chemistry. In one embodiment, the oxygen containing etch chemistry includes 175 sccm to 225 sccm $O_2$. The etch of the organic polymerization layer 9 with the oxygen containing etch chemistry may include a pressure ranging from 75 mTorr to 125 mTorr, a top RF power level ranging from 350 W to 450 W and a bottom RF power ranging from 40 W to 60 W. In one example, the etch chemistry contains 200 sccm O2, with the pressure of 100 mTorr, with the top and bottom RF power levels of 400 W and 50 W, respectively.

Figure 6:
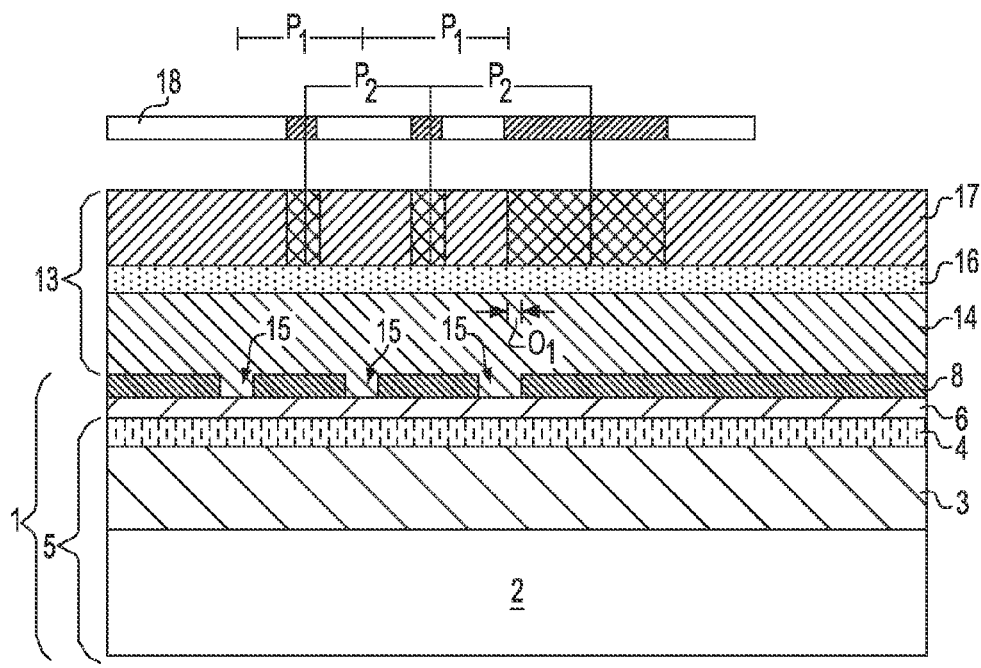
FIG. 6 is a side cross-sectional view of forming at least one second mask layer on the remaining portion of the leveling layer and the exposed portion of the metal nitride layer, and exposing the at least one second mask layer to a pattern for a second plurality of trenches having a second pitch, in accordance with one embodiment of the present disclosure.

FIG. 6 depicts one embodiment of forming at least one second mask layer (hereafter referred to as a second mask stack 13) on the remaining portion of the leveling layer 8 and the exposed portion of the metal nitride layer 6. The second mask stack 13 may include a second organic planarization layer (OPL) 14, a second anti-reflective coating (ARC) 16, and a second photoresist layer 17. The second organic planarization layer (OPL) 14 is present on an upper surface of the remaining portions of the leveling layer 8, and the exposed portions of the metal nitride layer 6 at the base portion of the first plurality of trenches 15 having the first pitch P1.

The second organic planarization layer (OPL) 14 that is depicted in FIG. 6 is similar in composition, thickness and method of forming to the first organic planarization layer (OPL) 9 that is depicted in FIG. 1. Therefore, the above description of the first organic planarization layer (OPL) 6 with reference to FIG. 1 is suitable for the second organic planarization layer (OPL) 14 that is depicted in FIG. 6. The composition of the material for the second organic planarization (OPL) 14 may be the same or different as the composition of the material for the first organic planarization layer (OPL) 9. In one example, the second organic planarization layer (OPL) 14 is composed of polyacrylate resin, epoxy resin, phenol resin, polyamide resin, polyimide resin, unsaturated polyester resin, polyphenylether resin, polyphenylene-sulfide resin, benzocyclobutene (BCB) or a combination thereof. In some instances, the second organic planarization layer (OPL) 14 may be referred to as a second carbon-containing planarization layer, such as amorphous carbon layer deposited using CVD process.

The second anti-reflective coating (ARC) 16 is formed on the upper surface of the second organic planarization layer (OPL) 14. The second anti-reflective coating (ARC) 16 that is depicted in FIG. 6 is similar in composition, thickness and method of forming to the first anti-reflective coating (ARC) 10 that is depicted in FIG. 1. Therefore, the above description of the first anti-reflective coating (ARC) 10 with reference to FIG. 1 is suitable for the second anti-reflective coating (ARC) 16 that is depicted in FIG. 6. The composition of the material for the second anti-reflective coating (ARC) 16 may be the same or different as the composition of the material for the first anti-reflective coating (ARC) 10. In one example, the second anti-reflective coating (ARC) 16 is composed of silicon containing organic material.

A second photoresist layer 17 is present on an upper surface of the second anti-reflective coating (ARC) 16. The second photoresist layer 17 that is depicted in FIG. 6 is similar in composition, thickness and method of forming to the first photoresist layer 11 that is depicted in FIG. 1. Therefore, the above description of the first photoresist layer 11 with reference to FIG. 1 is suitable for the second photoresist layer 17 that is depicted in FIG. 6. The composition of the material for the second photoresist layer 17 may be the same or different as the composition of the material for the first photoresist layer 11.

Figure 7:
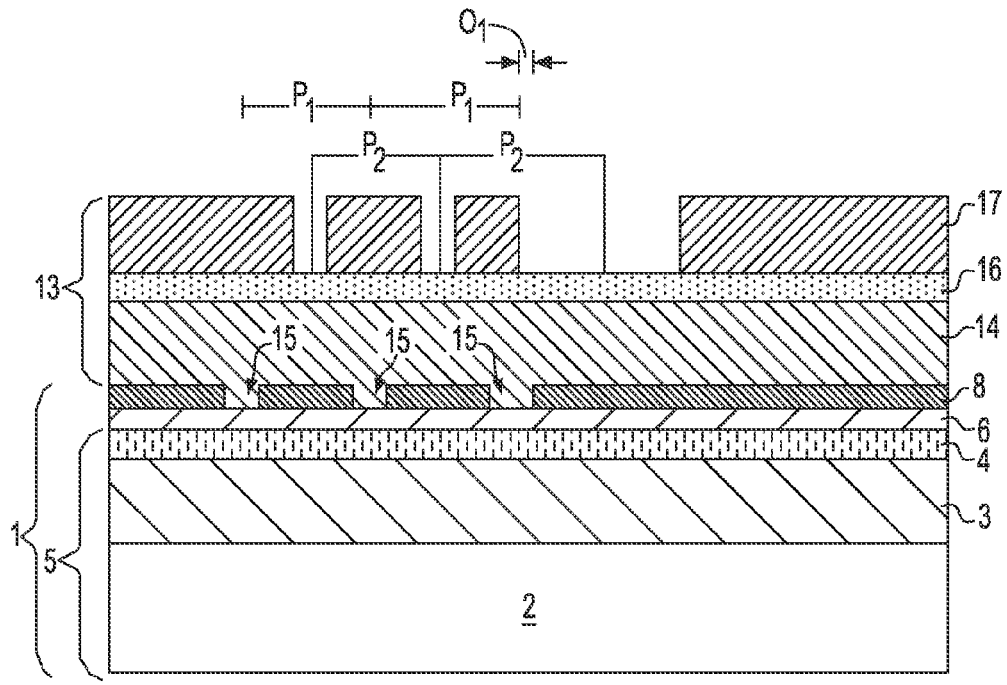
FIG. 7 is a side cross-sectional view of developing the pattern of the second plurality of trenches into the photoresist layer of the at least one second mask layer, in accordance with one embodiment of the present disclosure.
Figure 8:
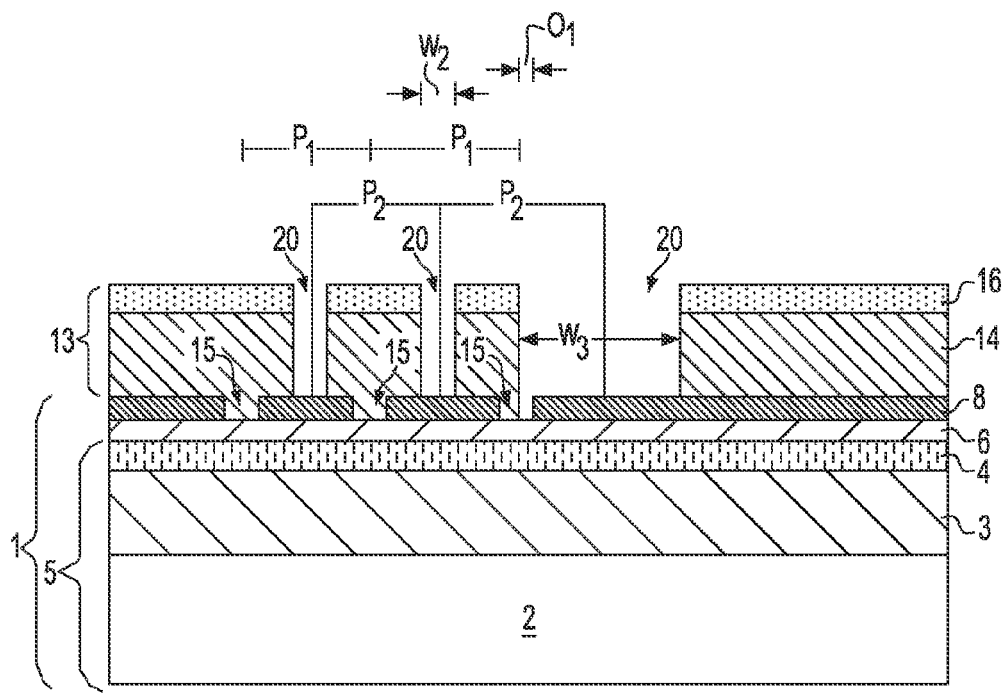
FIG. 8 is a side cross-sectional view of etching the pattern for the second plurality of trenches having the second pitch into a second organic planarization layer (OPL) of the at least one second mask layer with an etch process that is selective to the leveling layer, in accordance with one embodiment of the present disclosure.

FIGS. 6-8 depict one embodiment of patterning the second photoresist layer 17 to provide an etch mask for forming a second plurality of trenches 20 having a second pitch P2 into the second anti-reflective coating (ARC) 16 and the second organic planarization layer (OPL) 14 of the second masking layer 13. The patterning of the second photoresist layer 17 to provide the second plurality of trenches 20 is similar to the patterning of the first photoresist layer 11 to provide the first plurality of trenches 15 that is described above with reference to FIGS. 1-3, with the exception that the method for pattering the second photoresist layer 17 utilizes a second reticle 18 that may have a different pitch, i.e., second pitch P2, from the pitch P1 of the first reticle 12. Therefore, the above description of patterning the first photoresist layer 11 with reference to FIG. 1 is suitable for the patterning of the second photoresist layer 17 that is depicted in FIG. 6.

Referring to FIG. 6, in one embodiment, the patterning of the second photoresist layer 17 produces an etch mask that provides a second plurality of trenches 20 having a second pitch P2, wherein an overlapping trench portion O1 is present between the first plurality of trenches 15 having the first pitch P1 and the second plurality of trenches 20 having the second pitch P2. The second pitch P2 may be measured from the center of a first trench to the center of an adjacent trench. The actual dimensions for the second pitch P2 may depend upon the technology node. In one example, the second pitch P2 is less than 500 nm. In another example, the second pitch P2 ranges from 20 nm to 450 nm. In yet another example, the first pitch P2 ranges from 40 nm to 300 nm. In yet an even further example, the first pitch P2 ranges from 80 nm to 150 nm. The overlapped trench portion O1 between the first plurality of trenches 15 having the first pitch P1 and the second plurality of trenches 20 having the second pitch may have a width ranging from 1 nm to 100 nm. In another embodiment, the overlapping trench portion O1 may have a width ranging from 5 nm to 20 nm.

FIG. 7 depicts one embodiment of developing the exposed portions of the second photoresist layer 17. Development of the patterned second photoresist layer 17 is similar to the development of the first photoresist layer 11, as described above with reference to FIG. 2. Therefore, the above description of the development of the patterned first photoresist layer 11, as described with reference to FIG. 2, is suitable for the development of the patterned second photoresist layer 17, as depicted in FIG. 7. Following development of the patterned second photoresist layer 17, the portion of the second anti-reflective coating (ARC) 16 that corresponds to the subsequently formed second plurality of trenches 20 having the second pitch P2 is exposed.

FIG. 8 depicts etching the pattern for the second plurality of trenches 20 having the second pitch P2 into a second organic planarization layer (OPL) 14 with an etch that is selective to the leveling layer 8. In one embodiment, the etch that removes the exposed portions of the second anti-reflective coating (ARC) 16 and the second organic planarization (OPL) 14 has a selectivity ranging from 1:1 to 100:1 relative to the leveling layer 8. In another embodiment, the etch that removes the exposed portions of the second anti-reflective coating (ARC) 16 and the second organic planarization (OPL) 14 has a selectivity ranging from 1:1 to 5:1 relative to the leveling layer 8.

The etch process for forming the second plurality of trenches 20 having a second pitch P2 into the second organic planarization layer (OPL) 14 may be an anisotropic etch process. The anisotropic etch may include at least one of reactive-ion etching (RIE), ion-beam etching, plasma etching and laser ablation. The width W2 of each trench in the second plurality of trenches 20 that does not include the overlapping trench portion O1 with the first plurality of trenches 15 may range from 100 nm to 300 nm. In another embodiment, the width W2 of each trench in the second plurality of trenches 20 that does not include the overlapping trench portion O1 may range from 20 nm to 25 nm. The width W3 of each trench in the second plurality of trenches 20 that includes the overlapping trench portion O1 with the first plurality of trenches 20 may range from 20 nm to 500 nm. In another embodiment, the width W3 of each trench in the second plurality of trenches 20 that includes the overlapping trench portion O1 may range from 50 nm to 400 nm.

Still referring to FIG. 8, the etch process for forming the second plurality of trenches 20 having the second pitch P2 into the second organic planarization layer (OPL) 14 may also be selective to the exposed portion of the metal nitride layer 6 in the overlapping trench portion O1 between the first plurality of trenches 15 having the first pitch P1 and the second plurality of trenches 20 having the second pitch P2. In one embodiment, the overlapping trench portion O1 has a width ranging from 1 nm to 100 nm. In another embodiment, the overlapping trench portion O1 has a width ranging from 5 nm to 20 nm.

In one embodiment, the etch that removes the exposed portions of the second anti-reflective coating (ARC) 16 and the second organic planarization (OPL) 14 has a selectivity ranging from 5:1 to 100:1 relative to the metal nitride layer 6 in the overlapping portion O1 between the first plurality of trenches 15 having the first pitch P1 and the second plurality of trenches 20 having the second pitch P2. In another embodiment, the etch that removes the exposed portions of the second anti-reflective coating (ARC) 16 and the second organic planarization (OPL) 14 has a selectivity ranging from 5:1 to 10:1 relative to the metal nitride layer 6 in the overlapping portion O1 between the first plurality of trenches 15 having the first pitch P1 and the second plurality of trenches 20 having the second pitch P2.

In one example, in which the second photoresist layer 17 is composed of positive chemical amplified resist, the second anti-reflective coating (ARC) 16 is composed of silicon containing organic material, the second organic planarization layer (OPL) 14 is composed of carbon-hydrogen containing organic polymers, the metal nitride layer 8 is composed of titanium nitride, and the leveling layer 8 is composed of silicon oxide ($SiO_2$), the etch process for etching the second plurality of trenches 20 having a second pitch P2 into the second organic planarization layer (OPL) 14 may begin with an etch of the second anti-reflective coating (ARC) 16 using a fluorocarbon plasma, in which the second photoresist layer 17 functions as an etch mask. In one embodiment, the fluorocarbon plasma employed to etch the second anti-reflective coating is composed of 5 sccm to 15 sccm $C_4F_8$, 60 sccm to 100 sccm $CF_4$, and 35 sccm to 65 sccm $CHF_3$. The etch of the second anti-reflective coating (ARC) 16 with the fluorocarbon plasma may include a pressure ranging from 15 mTorr to 25 mTorr, a top RF power level ranging from 450 W to 550 W and a bottom RF power ranging from 100 W to 200 W. In one example, the fluorocarbon plasma contains 10 sccm $C_4F_8$, 80 sccm $CF_4$ and 50 sccm $CHF_3$, with a pressure level at 15 mTorr, with top and bottom RF power levels of 500 W and 100 w respectively. In a following etch step, the second organic planarization (OPL) layer 14 is etched using the remaining portion of the second anti-reflective coating (ARC) 16 as a mask. In one embodiment, the second organic planarization (OPL) layer 14 is etched with a plasma that contains 45 sccm to 65 sccm hydrogen bromide (HBr), 70 sccm to 90 sccm $CO_2$, 30 sccm to 50 sccm $O_2$, and 150 sccm to 250 sccm He. The etch of the second organic planarization (OPL) layer 14 may include a pressure ranging from 15 mTorr to 25 mTorr, a top RF power level ranging from 450 W to 550 W and bottom RF power ranging from 100 W to 200 W. In one example, the plasma contains 60 sccm hydrogen bromide (HBr), 80 sccm $CO_2$, 40 sccm $O_2$ and 200 sccm He, with the pressure of 20 mTorr, and top and bottom RF power levels of 500 W and 150 W respectively.

Figure 9:
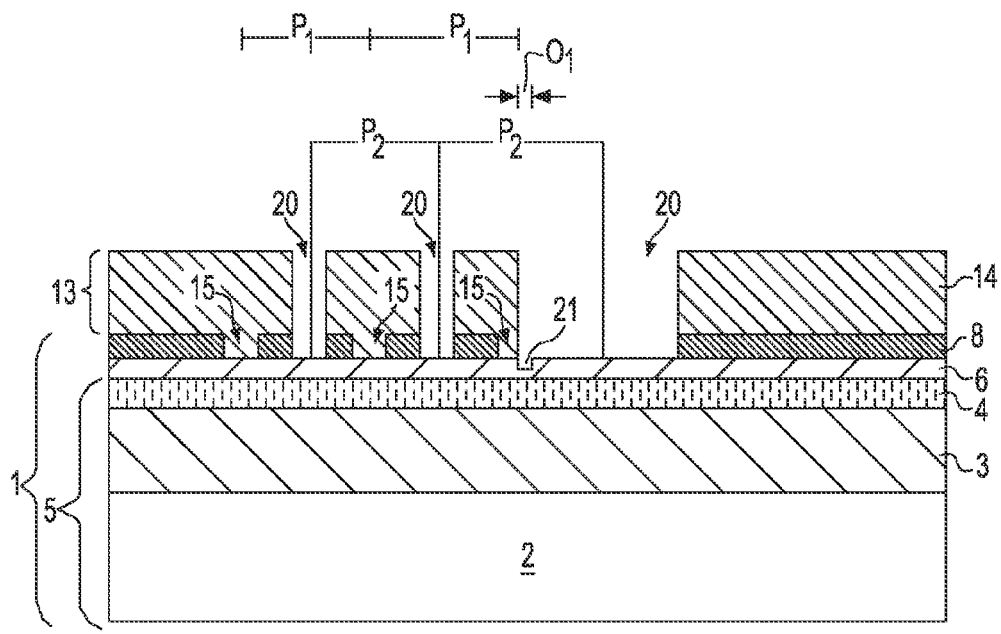
FIG. 9 is a side cross-sectional view of removing the exposed portion of a second anti-reflective coating (ARC) of the at least one second mask layer and an exposed portion of the leveling layer, in accordance with one embodiment of the present disclosure.

FIGS. 8 and 9 depict one embodiment of etching a second plurality of the trenches 20 into the leveling layer 8 with an etch that does not extend through the entire thickness of the metal nitride layer 6 of the material stack 1. In one embodiment, the portions of the leveling layer 8 that are not present in the overlapping trench portion O1, and are within the second plurality of trenches 20 having the second pitch P2, are removed stopping on the upper surface of the metal nitride layer 6. The portion of the leveling layer 8 that is present in the overlapping trench portion O1 is removed, wherein the etch may continue into the metal nitride layer 6, but not penetrating through the entire thickness of the metal nitride layer 6. The recess in the metal nitride layer 6 that is formed in the overlapping trench portion O1 between the first plurality of trenches 15 having the first pitch P1 and the second plurality of trenches 20 having the second pitch P2 may be referred to as a "stitch recess region". The stitch recess region may extend to a depth in the metal nitride layer 6 that is no greater than ¾ of the thickness of the metal nitride layer 6. In another embodiment, the stitch recess region may extend to a depth in the metal nitride layer 6 that is no greater than V2 of the thickness of the metal nitride layer 6.

The second anti-reflective coating (ARC) 16 may be removed prior to etching the pattern for the second plurality of the trenches 20 into the leveling layer 8, or may be removed during the etching of the pattern for the second plurality of the trenches 20 into the leveling layer 8. In the embodiment, in which the second anti-reflective coating (ARC) 16 is removed prior to etching of the pattern for the second plurality of the trenches 20 into the leveling layer 8, the second anti-reflective coating (ARC) 20 may be removed using fluorocarbon gas containing plasma chemistry. In the embodiment, in which the second anti-reflective coating (ARC) 20 is removed during the etching of the pattern for the second plurality of the trenches 20 into the leveling layer 8, the second anti-reflective coating (ARC) 16 may be removed using selective etching. In one example, the second anti-reflective coating (ARC) 16 is removed by an etch that is selective to the underlying second organic planarization layer (OPL) 14. In another example, the second anti-reflective coating (ARC) 16 is removed by the etch that removes the exposed portion of the leveling layer 8 selective to the metal nitride layer 6.

In one example, in which the leveling layer 8 is composed of silicon oxide ($SiO_2$), the second organic planarization layer (OPL) 14 is composed of carbon-hydrogen containing polymer, and the metal nitride layer 8 is composed of titanium nitride, the etch process for etching the second plurality of trenches 20 having a second pitch P2 into the leveling layer 8 includes an etch composed of fluorocarbon plasmas that uses the second anti-reflective coating (ARC) layer 16 and second organic planarization layer (OPL) layer 14 as masking layers. In one embodiment, the leveling layer 8 is etched with a plasma that contains 35 sccm to 65 sccm $CHF_3$, 1 sccm to 10 sccm $O_2$, and 35 sccm to 65 sccm $CF_4$. The etch of the leveling layer 8 may include a pressure ranging from 30 mTorr to 50 mTorr, a top RF power level ranging from 550 W to 650 W and a bottom RF power ranging from 75 W to 125 W. In one example, the etch chemistry for etching the leveling layer 8 contains 50 sccm $CHF_3$, 5 sccm $O_2$ and 50 sccm $CF_4$, with the pressure of 40 mTorr, and the top and bottom RF powers of 600 W and 100 W, respectively.

Further etch processing of the structure depicted in FIG. 9 will result in variations in trench depths across the semiconductor substrate 5 that result from the stitch recess region 21, unless the stitch recess region is removed. In one embodiment to provide a uniform trench depth for each of the trenches, i.e., first plurality of trenches 15 having the first pitch P1 and the second plurality of trenches 20 having the second pitch P2, the stitch recess region 21 is removed using the process sequence depicted in FIGS. 10-11.

Figure 10:
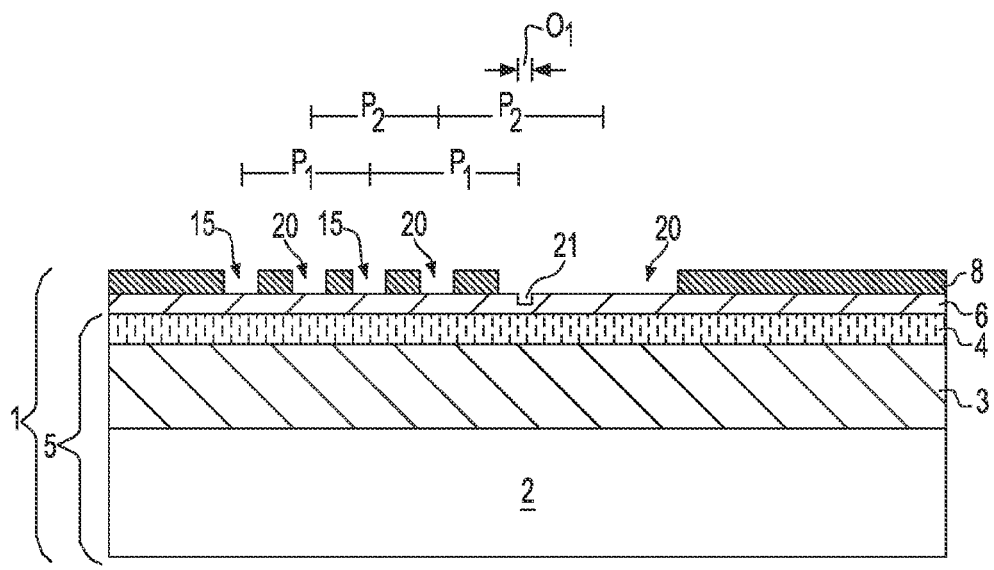
FIG. 10 is a side cross-sectional view of removing the second organic planarization layer (OPL) of the at least one second mask layer with an etch that is selective to the metal nitride layer, in accordance with one embodiment of the present disclosure.
Figure 11:
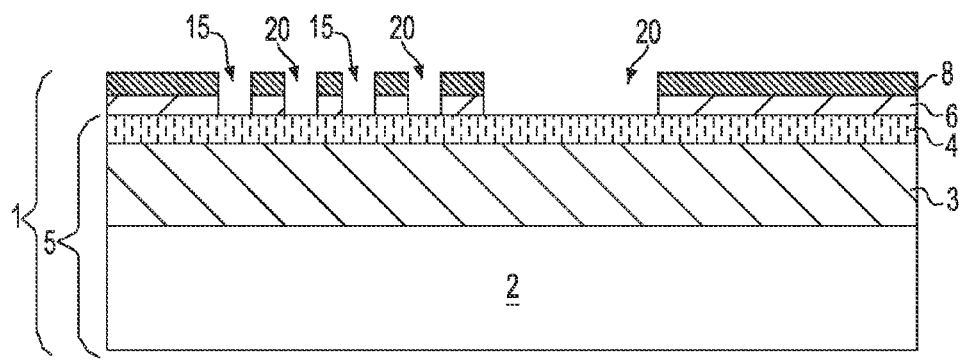
FIG. 11 is a side cross-sectional view of etching the exposed portions of the metal nitride layer with an etch that is selective to the remaining portion of the leveling layer and is selective to a semiconductor layer of the material stack, in accordance with one embodiment of the present disclosure.

FIGS. 10-11 depict extending the trench depth of the first plurality of trenches 15 having the first pitch P1 and the second plurality of trenches 20 having the second pitch P2 into the upper semiconductor layer 4 or dielectric layer of the semiconductor substrate 5, while removing the stitch recess region 21. By removing the stitch recess region 21, the base portion of each of the first plurality of trenches 15 having the first pitch P1 and the second plurality of trenches 20 having the second pitch P2 are at substantially the same depth in the semiconductor substrate 5, i.e., the base surfaces of each of the first plurality of trenches 15 and the second plurality of trenches 20 are coplanar.

FIG. 10 depicts removing the second organic planarization layer (OPL) 14 with an etch that is selective to the leveling layer 8 and the metal nitride layer 6. In one example, in which the leveling layer 8 is composed of silicon oxide ($SiO_2$), the second organic planarization layer (OPL) 14 is composed of carbon-hydrogen containing organic polymer, and the metal nitride layer 8 is composed of titanium nitride, the etch process for removing the second organic planarization layer (OPL) 14 includes an oxygen containing etch chemistry. In one embodiment, the oxygen containing etch chemistry that etches the second organic planarization layer 14 selectively to the leveling layer 8 includes 175 sccm to 225 sccm $O_2$. The etch of the second planarization layer 14 with the oxygen containing etch chemistry may include a pressure ranging from 75 mTorr to 125 mTorr, a top RF power level ranging from 350 W to 450 W and a bottom RF power ranging from 40 W to 60 W. In one example, the oxygen containing etch chemistry that etches the second organic planarization layer 14 contains 200 sccm $O_2$, with the pressure of 100 mTorr, with the top and bottom RF power levels of 400 W and 50 W, respectively.

FIG. 11 depicts etching the exposed portions of the metal nitride layer 6 with an etch that is selective to the remaining portion of the leveling layer 8 and the upper semiconductor layer 4 or the dielectric layer of the semiconductor substrate 5. In this embodiment, the remaining portion of the leveling layer 8 functions as a mask to remove the exposed portions of the metal nitride layer 6, which include the stitch recess region 21, selectively to the semiconductor layer 4 or the dielectric layer. By removing the exposed portion of the metal nitride layer 6 that includes the stitch recess region 21 with an etch that is selective to the semiconductor layer 4 or the dielectric layer, the base portions of the first plurality of trenches 15 having the first pitch P1 and the base portions of the second plurality of trenches 20 having the second pitch P2 are coplanar, and are in direct contact with the upper surface of the semiconductor layer 4 or the dielectric layer.

In one embodiment, the etch process that removes the exposed portions of the metal nitride layer 6 has a selectivity ranging from 2:1 to 100:1 relative to the remaining portion of the leveling layer 8 and the semiconductor layer 4 or the dielectric layer. In another embodiment, the etch that removes the exposed portions of the metal nitride layer 6 has a selectivity ranging from 5:1 to 10:1 relative to the remaining portion of the leveling layer 8 and the semiconductor layer 4 or the low-k dielectric layer of the semiconductor substrate 5. The etch process for removing the exposed portions of the metal nitride layer 6 and the stitch recess region 21 may be an anisotropic etch process. The anisotropic etch may include reactive-ion etching (RIE), ion-beam etching, plasma etching, laser ablation or a combination thereof.

In one embodiment, in which the leveling layer 8 is composed of silicon oxide ($SiO_2$), the metal nitride layer 6 is composed of titanium nitride (TiN), and the semiconductor layer 4 or the dielectric layer is composed of silicon, the etch process for etching the exposed portion of the metal nitride layer 6 selective to the remaining portions of the leveling layer 8 and the semiconductor layer 4 or the dielectric layer includes a $Cl_2$/Ar plasma etch chemistry. In one embodiment, the exposed portion of the metal nitride layer 6 is etched by a plasma that contains 50 sccm to 90 sccm $Cl_2$ and 175 sccm to 225 sccm Ar. The etch of the exposed portion of the metal nitride layer 6 may include a pressure ranging from 5 mTorr to 25 mTorr, a top RF power level ranging from 300 W to 400 W and a bottom RF power ranging from 75 W to 125 W. In one example, the etch chemistry contains 60~80 sccm $Cl_2$ and 200 sccm Ar, with the pressure of 10-20 mTorr and the top/bottom RF power of 350 W and 100 W respectively.

In a following process, the remaining portion of the leveling layer 8 may be utilized to extend the first plurality of trenches 15 having the first pitch P1 and the second plurality of the trenches 20 having the second pitch P1 into the underlying layers of the semiconductor substrate 5, such as the dielectric layer 3, i.e., buried dielectric layer. In one embodiment, because the base surfaces of the first plurality of trenches 15 and the second plurality of the trenches 20 are coplanar and free of stitch recess regions, the base portions of the trenches that are extending into the underlying layers of the semiconductor layer 5 will also be free of extra recess in the stitch recess regions.

While the claimed methods and structures has been particularly shown and described with respect to preferred embodiments thereof, it will be understood by those skilled in the art that the foregoing and other changes in form and details may be made therein without departing from the spirit and scope of the presently claimed methods and structures.

What is claimed is:

1. A method of forming a trench comprising:
  providing a material stack comprising a semiconductor layer or a dielectric layer, a metal nitride layer present on the semiconductor layer or the dielectric layer, a leveling layer that is present on the metal nitride layer, and at least one first mask layer on the leveling layer;
  etching a first plurality of trenches having a first pitch through the at least one first mask layer and the leveling layer, wherein the base of the first plurality of trenches stops on the metal nitride layer;
  removing the at least one first mask layer;
  forming at least one second mask layer on the leveling layer and an exposed portion of the metal nitride layer;
  etching a second plurality of trenches having a second pitch through at least the at least one second mask layer, wherein the base of the second plurality of trenches do not extend through the metal nitride layer;
  removing the at least one second mask layer; and
  etching exposed portions of the metal nitride layer selectively to the semiconductor layer or the dielectric layer and remaining portions of the leveling layer to extend the first plurality of trenches and the second plurality of trenches into contact with an upper surface of the semiconductor layer or the dielectric layer.

2. The method of claim 1, wherein the leveling layer has a thickness ranging from 10 nm to 100 nm, the metal nitride layer has a thickness ranging from 10 nm to 100 nm, and the semiconductor layer or the dielectric layer has a thickness ranging from 50 nm to 200 nm.

3. The method of claim 2, wherein the leveling layer is composed of a material that may be etched with a selectivity ranging from 5:1 to 100:1 to the metal nitride layer, and the metal nitride layer is composed of a material that may be etched with a selectivity ranging from 4:1 to 100:1 to the leveling layer and the semiconductor layer or the dielectric layer.

4. The method of claim 3, wherein the leveling layer is a dielectric selected from the group consisting of silicon oxide ($SiO_2$), silicon nitride ($Si_3N_4$), silicon carbide (SiC), silicon oxynitride ($Si_xO_yN_z$) and combinations thereof.

5. The method of claim 3, wherein the semiconductor layer is composed of a semiconductor selected from a group consisting of silicon, single crystal silicon, silicon germanium, silicon doped with carbon (Si:C), silicon germanium doped with carbon (SiGe:C) and combinations thereof.

6. The method of claim 3, wherein the metal nitride layer is selected from the group consisting of WN, WSiN, TiN, TiSiN, TaN, TaSiN, TiTaN, TaRuN or combinations thereof.

7. The method of claim 3, wherein the at least one first masking layer comprises a first organic planarization layer (OPL) present on the leveling layer, a first anti-reflective coating (ARC) present on the first organic planarization layer (OPL) and a first photoresist layer present on the first anti-reflective coating (ARC), and the at least one second masking layer comprises a second organic planarization layer (OPL) present on the leveling layer, a second anti-reflective coating (ARC) present on the second organic planarization layer (OPL) and a second photoresist layer present on the second anti-reflective coating (ARC).

8. The method of claim 1, wherein the etching of the first plurality of trenches having a first pitch through the at least one mask layer and the leveling layer comprises an anisotropic etch.

9. The method of claim 1, wherein the first pitch ranges from 10 nm to 500 nm, and the second pitch ranges from 10 nm to 500 nm.

10. The method of claim 1, wherein an overlapping trench portion is present between the first plurality of trenches and the second plurality of trenches.

11. The method of claim 10, wherein the etching of the second plurality of trenches having the second pitch comprises an etch chemistry that terminates on the leveling layer and does not etch into the semiconductor layer or the dielectric layer in the overlapped trench portion.

12. The method of claim 1, wherein the removing of the at least one second mask layer comprises an etch that is selective to the leveling layer and the metal nitride layer.

13. The method of claim 1, wherein following the etching of the exposed portions of the metal nitride layer selectively to the semiconductor layer and the remaining portions of the leveling layer, a base portion of the first plurality of trenches is coplanar with a base portion of the second plurality of trenches.

14. The method of claim 1, further comprising a buried dielectric layer under the semiconductor layer, and etching the first plurality of trenches and the second plurality of trenches into the buried dielectric layer.

15. A method of forming a trench comprising:
    providing a material stack comprising a silicon layer or a dielectric layer, a titanium nitride layer present on the silicon layer or low-k dielectric layer, and a silicon dioxide ($SiO_2$) layer present on the titanium nitride layer;
    forming a first masking stack including a first carbon-containing planarization layer that is present on the silicon oxide ($SiO_2$) layer;
    etching a first plurality of trenches having a first pitch through the at least one mask layer and the silicon oxide ($SiO_2$) layer, wherein the base of the first plurality of trenches stops on the titanium nitride layer;
    removing the first masking stack;
    forming a second masking stack including a second carbon-containing planarization layer on the silicon oxide ($SiO_2$) layer and an exposed portion of the titanium nitride layer;
    etching a second plurality of trenches having a second pitch through at least the second masking stack selectively to the silicon oxide ($SiO_2$) layer, wherein the base of the second plurality of trenches does not extend through the titanium nitride layer in an overlapping trench portion between the first plurality of trenches and the second plurality of trenches; and
    etching exposed portions of the titanium nitride layer selectively to the silicon layer or the dielectric layer and remaining portions of the silicon oxide ($SiO_2$) layer to extend the first plurality of trenches and the second plurality of trenches into contact with at least an upper surface of the silicon layer or the dielectric layer.

16. The method of claim 15, wherein the silicon oxide layer has been formed from tetraethyl orthosilicate ($Si(OC_2H_5)_4$).

17. The method of claim 15, wherein the first masking layer further comprises a first anti-reflective coating composed of a silicon containing organic material present on the first carbon-containing planarization layer and a first photoresist layer present on the first anti-reflective coating, and the second masking layer further comprises a second anti-reflective coating composed of a silicon containing organic material present on the first carbon containing planarization layer and a second photoresist layer present on the second anti-reflective coating.

18. The method of claim 17, wherein the etching of the first plurality of trenches comprises:
    an etch of the first anti-reflective coating with fluorocarbon plasmas using the first photoresist layer as a mask; and
    an etch of the first carbon containing planarization layer comprising a plasma comprising hydrogen bromide using a remaining portion of the first anti-reflective coating as a mask.

19. The method of claim 15, wherein the etching of the second plurality of trenches comprises:
    an etch of the second anti-reflective coating using a fluorocarbon plasma, in which the second photoresist layer functions as an etch mask; and
    an etch of the second carbon containing planarization layer comprising hydrogen bromide using the remaining portion of the second anti-reflective coating as a mask.

20. The method of claim 15, wherein the etching the exposed portions of the titanium nitride layer selectively to the silicon layer or the low-k dielectric layer and the remaining portions of the silicon oxide ($SiO_2$) layer to extend the first plurality of trenches and the second plurality of trenches into contact with an upper surface of the silicon layer or the low-k dielectric layer comprises:
    an oxygen containing etch chemistry to etch the second carbon-containing planarization layer selectively to the silicon oxide layer; and
    a chlorine containing plasma etch chemistry for etching the exposed portions of the titanium nitride layer selective to the remaining portions of the silicon oxide ($SiO_2$) and the semiconductor layer or the low-k dielectric layer.

* * * * *